(12) United States Patent
Mirza et al.

(10) Patent No.: US 7,243,318 B1
(45) Date of Patent: Jul. 10, 2007

(54) INTEGRATED TEST PROCESSOR (ITP) FOR A SYSTEM ON CHIP (SOC) THAT INCLUDES A NETWORK ON CHIP (NOC)

(75) Inventors: Nasir M. Mirza, Overland Park, KS (US); Tamrat Asfaw, Overland Park, KS (US); Naveed Ahmed, Kansas City, MO (US)

(73) Assignee: Sprint Communications Company L.P., Overland Park, KS (US)

( * ) Notice: Subject to any disclaimer, the term of this patent is extended or adjusted under 35 U.S.C. 154(b) by 403 days.

(21) Appl. No.: 10/929,294

(22) Filed: Aug. 30, 2004

(51) Int. Cl.
*G06F 17/50* (2006.01)
(52) U.S. Cl. .................... 716/4; 716/1; 716/5
(58) Field of Classification Search .............. 716/4, 716/5, 1
See application file for complete search history.

(56) References Cited

U.S. PATENT DOCUMENTS

| | | |
|---|---|---|
| 6,414,498 B2 | 7/2002 | Chen |
| 6,564,349 B1 | 5/2003 | Mitten et al. |
| 6,615,167 B1 | 9/2003 | Devins et al. |
| 6,785,854 B1 * | 8/2004 | Jaramillo et al. ........... 714/729 |
| 2003/0106004 A1 | 6/2003 | Ricchetti et al. |
| 2003/0145290 A1* | 7/2003 | Devins et al. .................. 716/4 |
| 2005/0193254 A1* | 9/2005 | Yee .............................. 714/30 |

OTHER PUBLICATIONS

Yi-Ran Sun, "Simulation and Performance Evaluation for Network on Chip", Dec. 12, 2001, Master of Science Thesis, pp. 1-90.*
The CoreConnect™ Bus Architecture, International Business Machines Corporation, copyright 1999, Retrieved from the Internet: <http://www-306.ibm.com/chips/techlib/techlib.nsf/techdocs/852569B20050FF77852569910050C0FB/$file/crcon_wp.pdf> pp. 1-8.
Early Analysis Tools For System-On-A-Chip Design, J.A. Darringer, R.A. Bergamaschi, S. Bhattacharya, D. Brand, A. Herkersdorf, J.K. Morrell, I.I. Nair, P. Sagmeister, Y. Shin, IBM J. Res. & Dev., pp. 691-707, vol. 46, No. 6, Nov. 2002.

* cited by examiner

*Primary Examiner*—Sun James Lin

(57) ABSTRACT

A system on chip (SOC) is provided according to an embodiment of the invention. The SOC includes a storage system, a network on chip (NOC) adapted to communicate with a communication network, and a processing system in communication with the storage system and with the NOC. The processing system is configured to conduct operations of the SOC and perform communication operations using the NOC. The SOC further includes an integrated test processor (ITP) in communication with the processing system, the storage system, and the NOC. The ITP is configured to generate a logical function test instruction for testing one or more logical functions of the SOC and generate a physical link test instruction for testing one or more physical links of the SOC.

4 Claims, 7 Drawing Sheets

INTEGRATED TEST PROCESSOR (ITP) FOR A SYSTEM ON CHIP (SOC) THAT INCLUDES A NETWORK ON CHIP (NOC)

RELATED APPLICATIONS

Not applicable

FEDERALLY SPONSORED RESEARCH OR DEVELOPMENT

Not applicable

MICROFICHE APPENDIX

Not applicable

BACKGROUND OF THE INVENTION

1. Field of the Invention

The invention is related to a system on chip (SOC) that includes a network on chip (NOC), and in particular, to a SOC that includes a network on chip (NOC) and further includes an integrated test processor (ITP).

2. Description of the Prior Art

Computers and computerized devices have become increasingly more complex. As a result of modern fabrication technology, integrated circuits (i.e., chips) have become smaller and smaller. This has been achieved while including larger number of components and while achieving more and more functions.

This increased complexity has lead to increased cost and difficulty in manufacturing. The increasing number of components and circuits require more and more testing to ensure functionality and reliability. Many computers and computerized devices employ specialized on-chip circuitry in order to perform testing on the chip before it can be approved and sold to customers.

One area of electronics in which chip complexity has dramatically increased is in the area of communication chips. The increased reliance on communication networks, such as packet-based networks and public switched telephone networks (PSTNs), for example, has lead to the development of more powerful communications circuits and functions on chips. Such communications continue to demonstrate a need for increased methods and devices for testing the chips. Rigorous and complete testing is needed in order to test a chip design for proper and efficient operation before manufacture, in order to test chips during manufacture to ensure that quality meets acceptable levels, and in order to test the chips during operation in order to ensure continued proper operation.

SUMMARY OF THE INVENTION

A system on chip (SOC) is provided according to an embodiment of the invention. The SOC comprises a storage system, a network on chip (NOC) adapted to communicate with a communication network, and a processing system in communication with the storage system and with the NOC. The processing system is configured to conduct operations of the SOC and perform communication operations using the NOC. The SOC further comprises an integrated test processor (ITP) in communication with the processing system, the storage system, and the NOC. The ITP is configured to generate a logical function test instruction for testing one or more logical functions of the SOC and generate a physical link test instruction for testing one or more physical links of the SOC.

A method of testing a system on chip (SOC) that includes a network on chip (NOC) is provided according to an embodiment of the invention. The method comprises generating a physical link test instruction in an integrated test processor (ITP) of the SOC for testing one or more physical links of the SOC and generating a logical function test instruction in the ITP for testing one or more logical functions of the SOC.

A method of testing a system on chip (SOC) that includes a network on chip (NOC) is provided according to an embodiment of the invention. The method comprises generating a test message in an integrated test processor (ITP) of the SOC. The test message is designed to test one or more physical links or one or more logical functions of the SOC. The method further comprises transmitting the test message to one or more test message destinations on the SOC, determining whether a proper response is received in the ITP in response to transmitting the test message, recording a test success if the proper response is received, and recording a test failure if the proper response is not received.

A method of testing a system on chip (SOC) that includes a network on chip (NOC) is provided according to an embodiment of the invention. The method comprises performing individual SOC component tests, determining whether one or more test failures occurred in the individual SOC component tests, processing individual SOC component test failures, logging individual SOC component test successes, performing SOC system tests if the individual SOC component tests passed, processing SOC system test failures, and logging SOC system test successes.

A method of testing a system on chip (SOC) that includes a network on chip (NOC) is provided according to an embodiment of the invention. The method comprises detecting a heartbeat time period expiration in an integrated test processor (ITP) of the SOC, determining whether a heartbeat signal has been received from a SOC component, and setting a heartbeat error condition if the heartbeat signal was not received during the heartbeat time period.

BRIEF DESCRIPTION OF THE DRAWINGS

The same reference number represents the same element on all drawings.

DETAILED DESCRIPTION OF THE PREFERRED EMBODIMENT

FIGS. 1–7 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
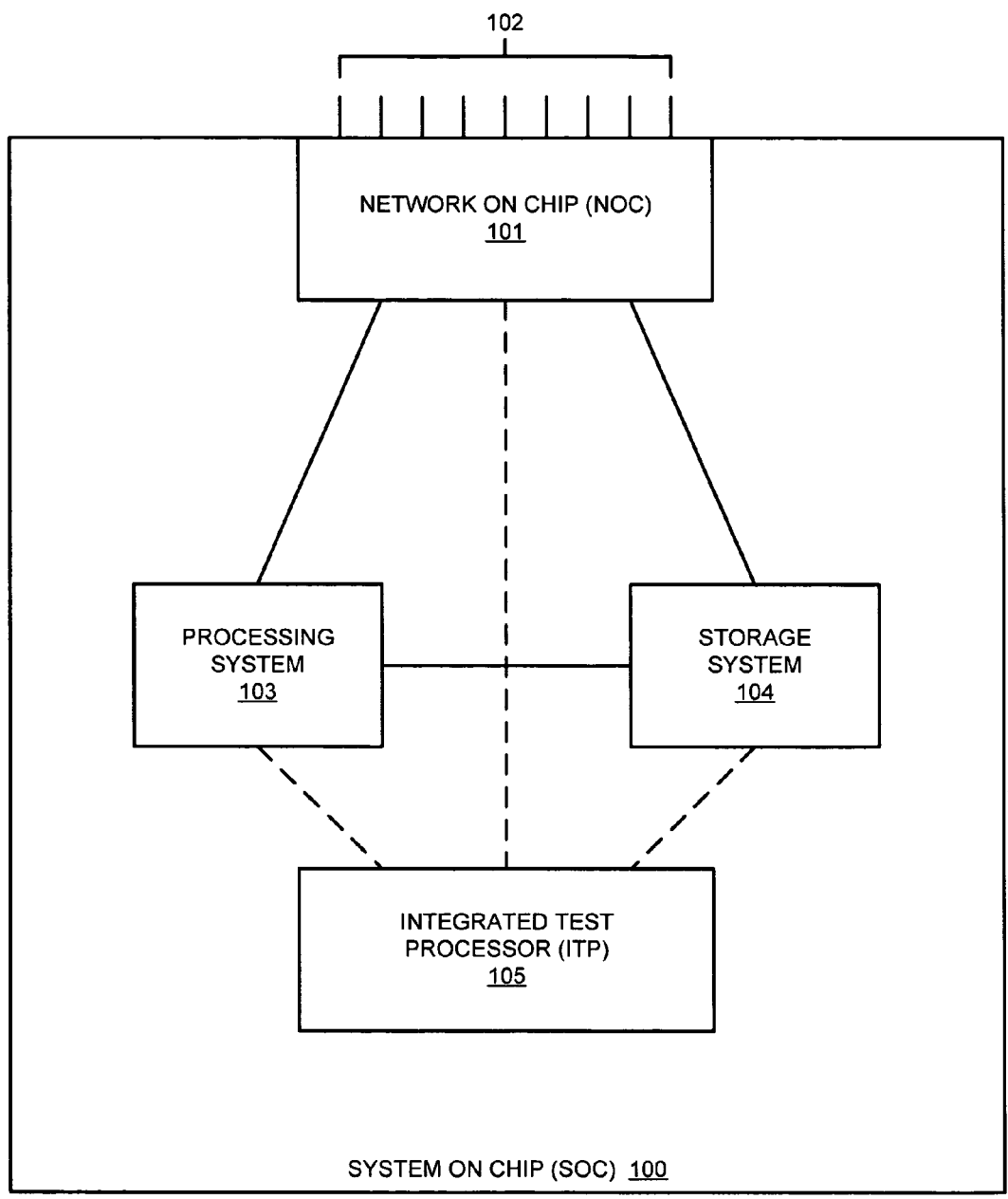
FIG. 1 shows a system on chip (SOC) according to an embodiment of the invention.

FIG. 1 shows a system on chip (SOC) 100 according to an embodiment of the invention. The SOC 100 includes a network on chip (NOC) 101 including multiple input/output (I/O) pins 102, a processing system 103, a storage system 104, and an integrated test processor (ITP) 105. The NOC 101 is connected to the processing system 103 and the storage system 104. In addition, the storage system 104 is connected to the processing system 103. Further, the ITP 105 is connected to and in communication with the NOC 101, the processing system 103, and the storage system 104.

The NOC 101 performs network communication functions. For example, the NOC 101 can perform routing functions, can perform gateway functions, can perform protocol or address translation, can perform security functions, etc. The NOC 101 can communicate with one or more networks, network devices, etc., over the pins 102.

The processing system 103 controls general operations of the SOC 100. The processing system 103 can comprise a computer microprocessor, logic circuit, or some other processing device. The processing system 103 can be distributed among multiple processing devices. The processing system 103 retrieves and executes a SOC operation routine from the storage system 204. The SOC operation routine can comprise an application program, firmware, or some other form of machine-readable processing instructions.

The storage system 104 can comprise a disk, tape, integrated circuit, or some other memory device. The storage system 104 can be distributed among multiple memory devices. The storage system 104 stores software routines, settings and data, temporary working data, etc., for the processing system 103. In addition, the storage system 104 can optionally store routines and data for the ITP 105.

The ITP 105 conducts tests of the SOC 100. The ITP 105 can include a processor portion and can optionally include a memory portion (not shown). The ITP 105 can be programmed with test routines for testing the SOC 100, and more specifically for testing the NOC 101 (in addition to testing the processing system 103 and the storage system 104). Consequently, any test routines and test data can be stored in the storage system 104, in the ITP 105, or in both.

The testing can comprise autonomous testing of the SOC 100 by the ITP 105. For example, the ITP 105 can be programmed to perform predetermined tests at predetermined times. In addition, the ITP 105 can perform tests under control of a technician or operator. For example, the ITP 105 in one embodiment can be externally accessed through the NOC 101, wherein the operator can select and initiate tests, receive test results, etc.

The ITP 105 is operable to test the SOC 100 at three different and distinct phases: at the design phase, before the SOC 100 chip is actually fabricated, during manufacture, in order to determine whether the SOC 100 contains any flaws or errors, and during operation, to ensure that the SOC 100 is operating properly and reliably.

During the design phase of the SOC 100, the ITP 105 can be used to simulate or model operation of the SOC 100, including simulating diagnostic operations that could occur during the manufacturing phase and during the operational phase. The ITP 105 can be used to simulate and design physical and logical test procedures for the SOC 100, can be used to define data and operations used during a test, can be used to optimally configure the ITP 105 and the SOC 100, etc. Emulations of the SOC 100 therefore can include emulations of the ITP 105, wherein all functions of the ITP 105 can be modeled in order to determine that the ITP 105 will function properly in the manufacturing phase and in the operational phase.

During the manufacturing phase of the SOC 100, the ITP 105 can be used to test the SOC 100 to ensure that it was properly manufactured. The ITP 105 in the manufacturing phase can test physical links on the SOC 100. For example, the ITP 105 can generate and transmit commands that communicate with the NOC 101, the processing system 103, or the storage system 104 and should prompt a specific operation on the part of the receiving component. For example, the command can generate a response communication from the particular component to the ITP 105. If the specific operation does not occur, the ITP 105 can determine a fault in that particular component or in the physical link between the ITP 105 and the particular component.

In addition, the ITP 105 can be used to exercise and test the logical functions of the SOC 100. For example, the ITP 105 can send a specific command to a particular component that includes a data component, and a reply message can be examined by the ITP 105 to see if the particular component properly processed the original command. In one example, the command can comprise a routing command, and the reply can be examined by the ITP 105 to see if a correct routing instruction is returned to the ITP 105. Alternatively, the command can be used to determine if routers in the NOC 101 form the proper connections. It should be understood that the logical testing can be designed to test any and all components of the NOC 101.

The logical function testing can test some or all of the logical functions provided by the SOC 100. For example, the ITP 105 can be designed to test only the most important logical functions or to test the logical functions most likely to have errors.

During the operational phase of the SOC 100, the ITP 105 can be used to ensure that the SOC 100 is operating properly. The operational testing can perform physical link testing and logical function testing as described above. In addition, the operational testing can perform heartbeat testing, wherein a substantially periodic heartbeat signal is transmitted from a particular component to the ITP 105. If the expected heartbeat signal is not received, the ITP 105 can determine that the particular component is not functioning properly. As a result, the ITP 105 can set an error condition, can generate a report to an external device, can initiate further tests on the particular component, etc.

The ITP 105 can be a programmable device. For example, the SOC 100 can comprise a circuit board or card, wherein the NOC 101, the processing system 103, the storage system 104, and the ITP 105 are components of the circuit board or card. The ITP 105 can comprise a subsystem or subcomponent of the SOC 100 or can comprise a chip affixed to the SOC 100. The ITP 105 can be a removable component, such as fitting into a socket or receptacle of the SOC 100. Alternatively, the ITP 105 can include pins or pads that enable communication with external devices for programming, reading values, etc. In another alternative, the ITP 105 can be programmed through the NOC 101.

Figure 2:
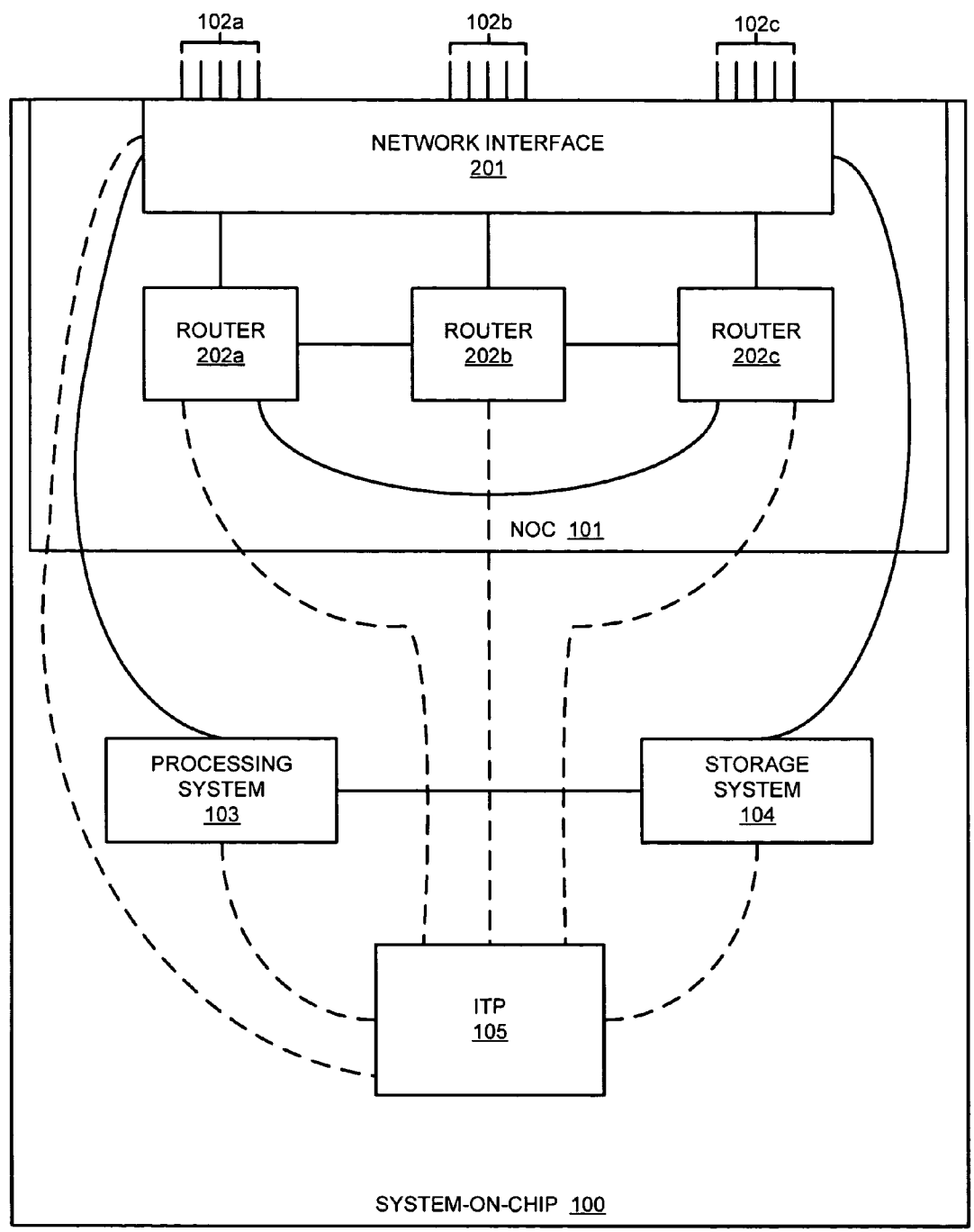
FIG. 2 shows the SOC according to another embodiment of the invention.

FIG. 2 shows the SOC 100 according to another embodiment of the invention. The components in common with FIG. 1 share the same reference numerals. The overall operation of the SOC 100 and the ITP 105 is the same as in FIG. 1. This figure illustrates an embodiment of the NOC 101. In this embodiment, the figure shows the NOC 101 as comprising at least one network interface 201 and one or more routers 202. However, it should be understood that the NOC 101 can alternatively include additional or different components. For example, the NOC 101 can include network components such as modems, gateways, network address translation (NAT) devices, security devices/functions, firewalls, switches or soft switches, encryption devices/functions, protocol translators, conferencing devices/functions, etc. Other network devices/functions are contemplated and are included in the scope of the specification and claims.

The network interface 201 interfaces to one or more external communication networks or to one or more network components of one or more external communication networks. The network interface 201 performs communication operations and enables communication sessions with external devices or networks. The network interface 201 can include multiple pins for corresponding network devices, such as the groups of pins shown for each router of this embodiment of the SOC 100.

The routers 202 route communications between sources and destinations. The routers 202 therefore can connect together pins of the network interface 201. For example, router 202*b* can connect together two or more pins 102*b* of the router 202*b*. Alternatively, the router 202*b* can connect together two or more pins of various routers, such as the pins 102*a* and 102*b* of the corresponding routers 202*a* and 202*b* (i.e., router 202*b* can connect to router 202*a*). In this manner, the routers 202 can route communications.

Figure 3:
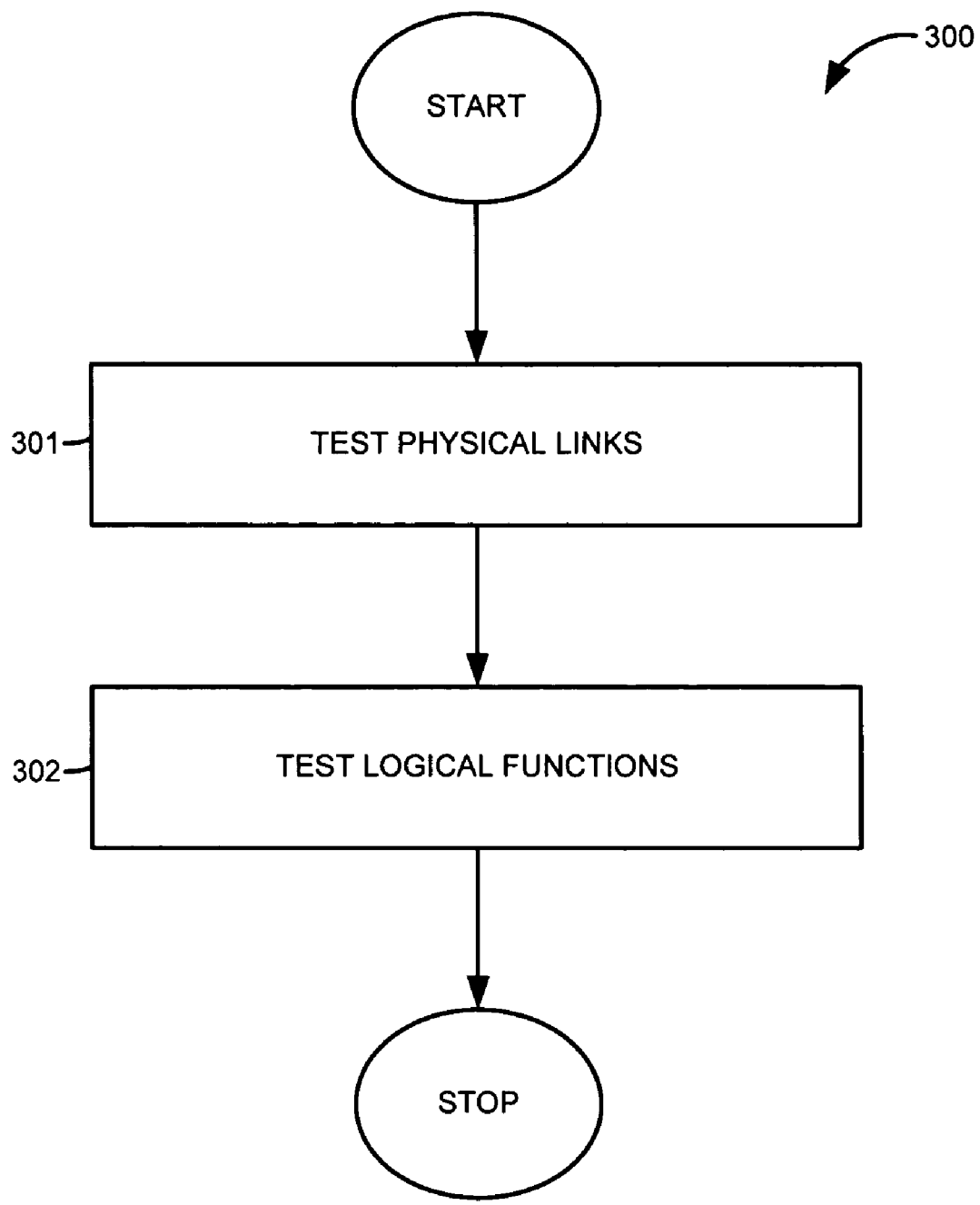
FIG. 3 is a flowchart of a method of testing a SOC that includes a NOC according to an embodiment of the invention.

FIG. 3 is a flowchart 300 of a method of testing a SOC 100 that includes a NOC 101 according to an embodiment of the invention. In step 301, an ITP 105 of the SOC 100 tests physical links of the SOC 100. The testing can determine whether physical links are operating correctly. The testing can comprise sending a test message and determining if a proper response is received. If a physical link is damaged or destroyed, the proper response will not be received by the ITP 105. It should be noted that a proper response can include receiving a response within a predetermined time period.

In step 302, the ITP 105 tests logical functions of the SOC 100. The logical functions can comprise operations performed by circuitry or software routines of the SOC 100. The testing can include sending requests and/or commands to a particular logical function and determining if a proper response is received. Consequently, not only must a response be received, but the response must conform to a desired/proper response. For example, the ITP 105 can request configuration values of a component of the SOC 100 and can determine a fault in the SOC 100 if the returned configuration value(s) is missing, out of range or illegal, takes longer than a predetermined time period to respond, etc.

Figure 4:
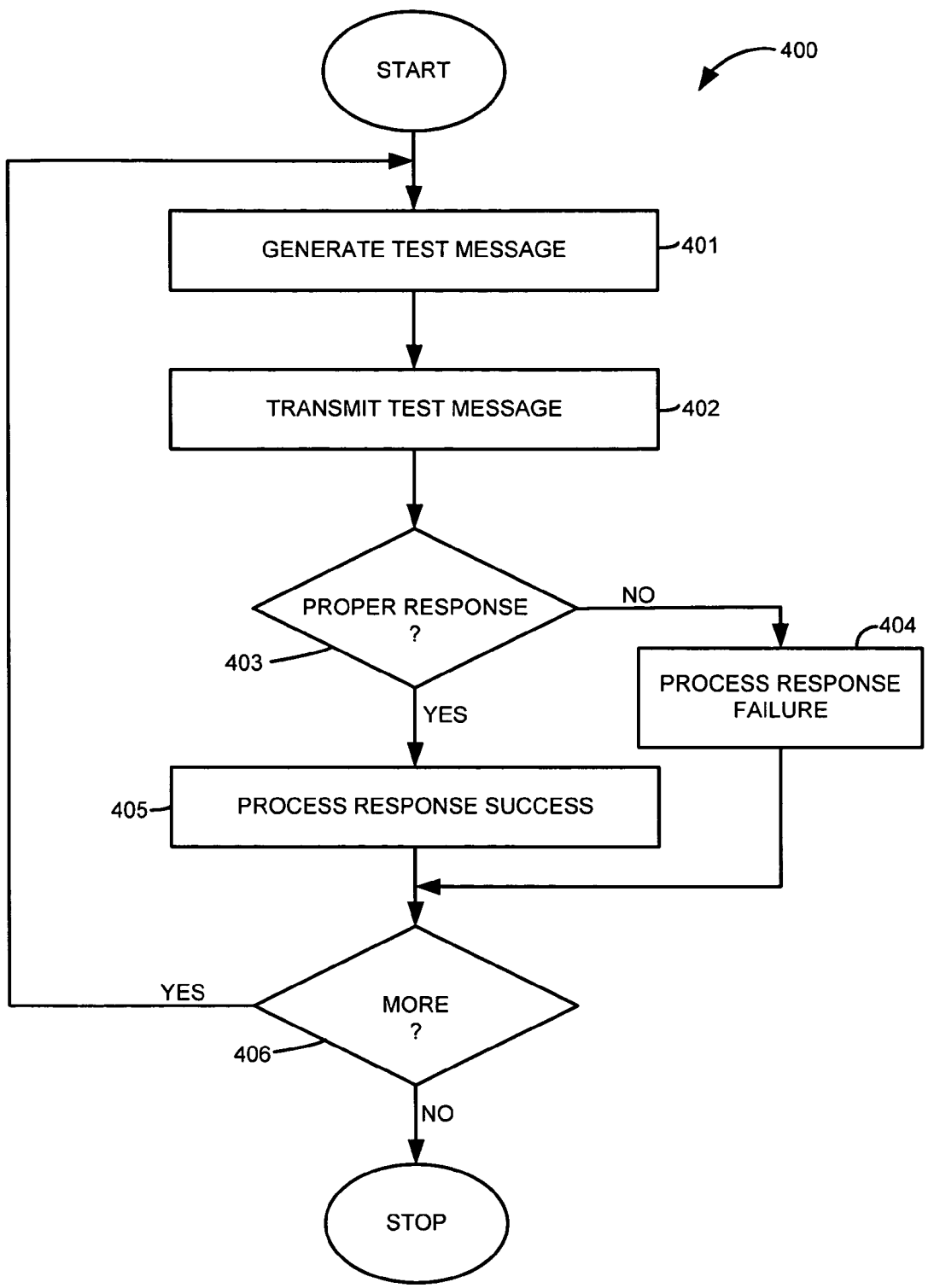
FIG. 4 is a flowchart of a method of testing a SOC that includes a NOC according to another embodiment of the invention.

FIG. 4 is a flowchart 400 of a method of testing a SOC 100 that includes a NOC 101 according to another embodiment of the invention. In step 401, the ITP 105 generates a test message. The test message can comprise a physical test message that is designed to test one or more physical links of the SOC 100. Alternatively, the test message can comprise a logical test message that is designed to test one or more logical functions of the SOC 100. The test message can be generated by recalling the test message from one or more stored test messages and configuring the test message with test data.

In step 402, the ITP 105 transmits the test message to the test message destination on the SOC 100. The test message destination can comprise the processing system 103, the storage system 104, or the NOC 101 (or a component thereof). It should be understood that the test message destination can further comprise multiple components of the SOC 100.

In step 403, the ITP 105 determines whether a proper response has been received from the test message destination. It should be noted that one or more responses can be received for a single test message. This can comprise merely determining whether a response has been received. A simple response may be adequate to determine whether a physical link of the SOC 100 is functioning properly. Alternatively, the determining can comprise comparing the response to a response template in order to determine whether the response is a proper response. The template can specify a sending component, a data payload, a message format, etc. In addition, the determination can comprise determining whether the response was received within a predetermined response period, wherein the response is determined to be an improper response if it is not received within the period. The predetermined response period can be set by a timer or by an interrupt service routine, for example. If the response is determined to be a proper response, the method proceeds to step 405; otherwise the method branches to step 404.

In step 404, it has been determined by the ITP 105 that a proper response to the test message has not been received. Therefore, the ITP 105 processes the response failure. The processing can include determining whether the response failure comprises an error and can assess the level of severity of the response failure. The processing can include any manner of response failure recording, such as recording the failure in a file or log, etc. In addition, the processing can initiate other actions, such as initiating further diagnostic and/or repair routines. Furthermore, the processing can include the SOC 100 sending out an error message over an associated communication network, etc.

In step 405, it has been determined by the ITP 105 that a proper response has been received, i.e., a response success. Consequently, the ITP 105 can record the response success. A log of successes and failures can be externally accessed by a technician or troubleshooter in order to see if the SOC 100 is operating properly. The log of successes and failures can be used in all three phases, i.e., in the design phase, in the manufacturing phase, and in the operational phase.

In step 406, the ITP 105 determines whether other tests are to be performed. If other tests are to be performed, the method loops back to step 401. As a result, the ITP 105 can iteratively test various physical links and logical functions of the SOC 100 and can perform multiple such tests. For example, the ITP 105 can run tests for testing each physical link of the SOC 100. In addition, the ITP 105 can run tests for testing each logical function of the SOC 100. A single logical function test message can test one or more logical functions. However, a single logical function may require multiple tests in order to accurately and fully test that logical function.

Figure 5:
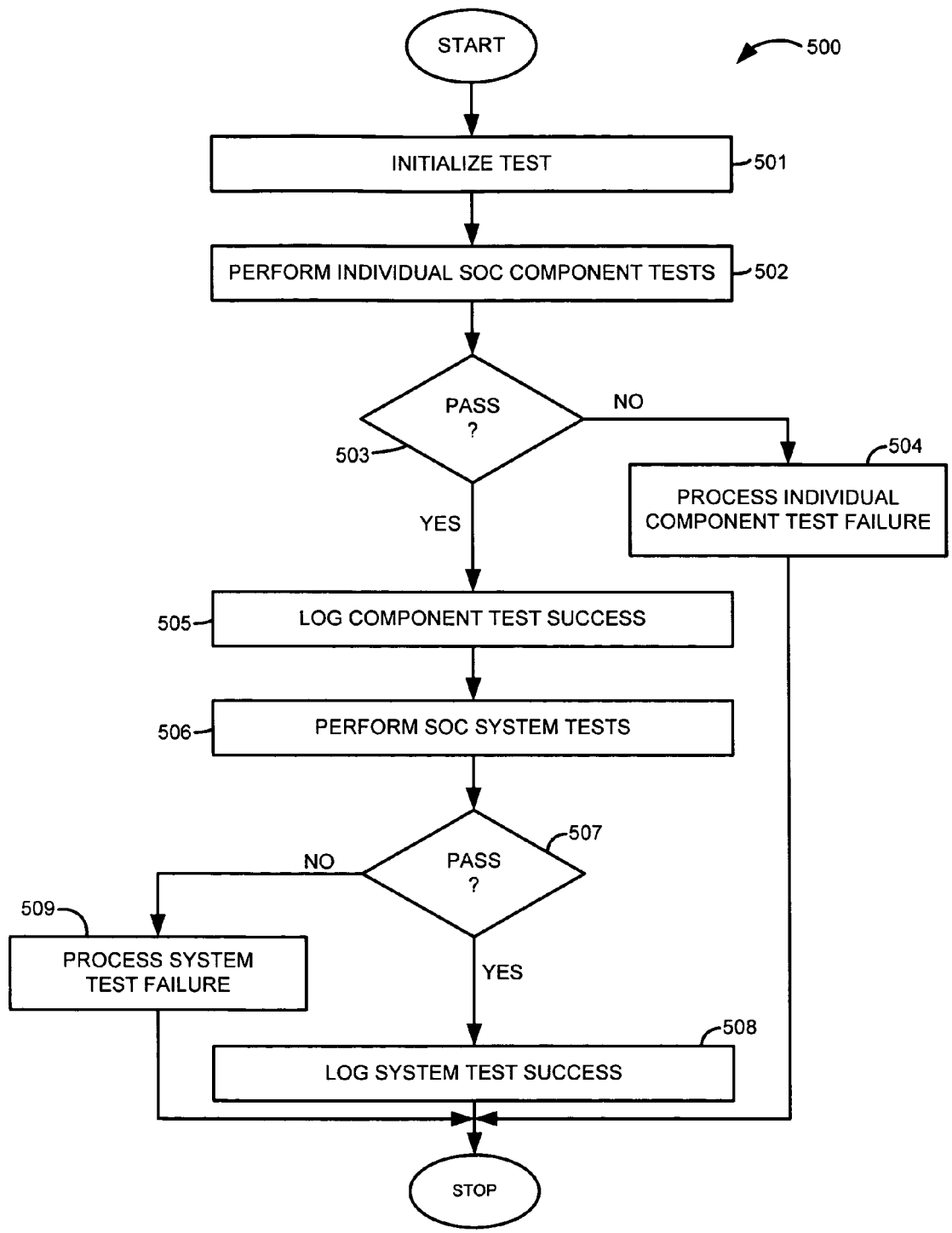
FIG. 5 is a flowchart of a method of testing a SOC that includes a NOC according to yet another embodiment of the invention.

FIG. 5 is a flowchart 500 of a method of testing a SOC 100 that includes a NOC 101 according to yet another embodiment of the invention. In step 501, a test is initialized. The initialization can include recalling test messages and configuring the test messages with test data.

In step 502, individual components of the SOC 100 are tested. The individual SOC component tests can include testing the physical links. In addition, the individual SOC component tests can include testing logical functions provided by a single SOC component. For example, the logical component testing can include reading configuration values of a SOC component and receiving and evaluating responses from a single SOC component.

In step 503, the ITP 105 determines whether the individual SOC component tests have passed. Whether the individual SOC components pass or fail can be determined by a set of individual SOC component pass criteria. The individual SOC component pass criteria can determine an individual SOC component failure if one or more test failures occur, can determine a SOC component failure depending on the severity of the errors, etc. If the tests pass, the method proceeds to step 505; otherwise the method branches to step 504.

In step 504, the ITP 105 processes the individual component test failure or failures. The ITP 105 can log test failure occurrences, can log test failure descriptions, and can log test failure data, including data transmitted and test data received in response to the transmission. Such data can be useful in determining the cause of the test failure, and can be useful for preventing future occurrences of the same test failure. In addition, the ITP 105 can initiate further testing based on any test failures that occur. For example, if a logical function does not return expected data, further diagnostic messages can be composed and transmitted to the SOC component in question. When the test failure processing is complete, the method exits and no system testing is performed.

In step 505, individual SOC component test successes are logged. The test successes can provide useful information for the design, manufacture, and operational phases.

In step 506, if the individual SOC component tests are passed, the ITP 105 can test the SOC system, i.e., the ITP 105 can test overall operation of the SOC 100 as a unit, wherein multiple components and/or multiple logical functions are tested. For example, the ITP 105 can test the interactions of multiple SOC components or the interactions of multiple SOC logical functions. In addition, the ITP 105 can test the interactions of the SOC 100 with an external device or external communication network.

In step 507, the ITP 105 determines whether the SOC 100 passed the SOC system tests. Whether the SOC system passes or fails can be determined by a set of system pass criteria. If the tests pass, the method proceeds to step 508; otherwise the method branches to step 509.

In step 508, the system test successes are logged. The test results, including successes and failures, can be useful for determining the operation of the SOC 100, including determining whether the operations of the SOC 100 can be streamlined or otherwise improved.

In step 509, the ITP 105 processes the system test failure or failures. The ITP 105 can log test failure occurrences, can log test failure descriptions, and can log test failure data, including data transmitted and test data received in response to the transmission. Such data can be useful in determining the cause of the system test failure, and can be useful for preventing future occurrences of the same system test failure. In addition, the ITP 105 can initiate further testing based on any system test failures that occur.

Figure 6:
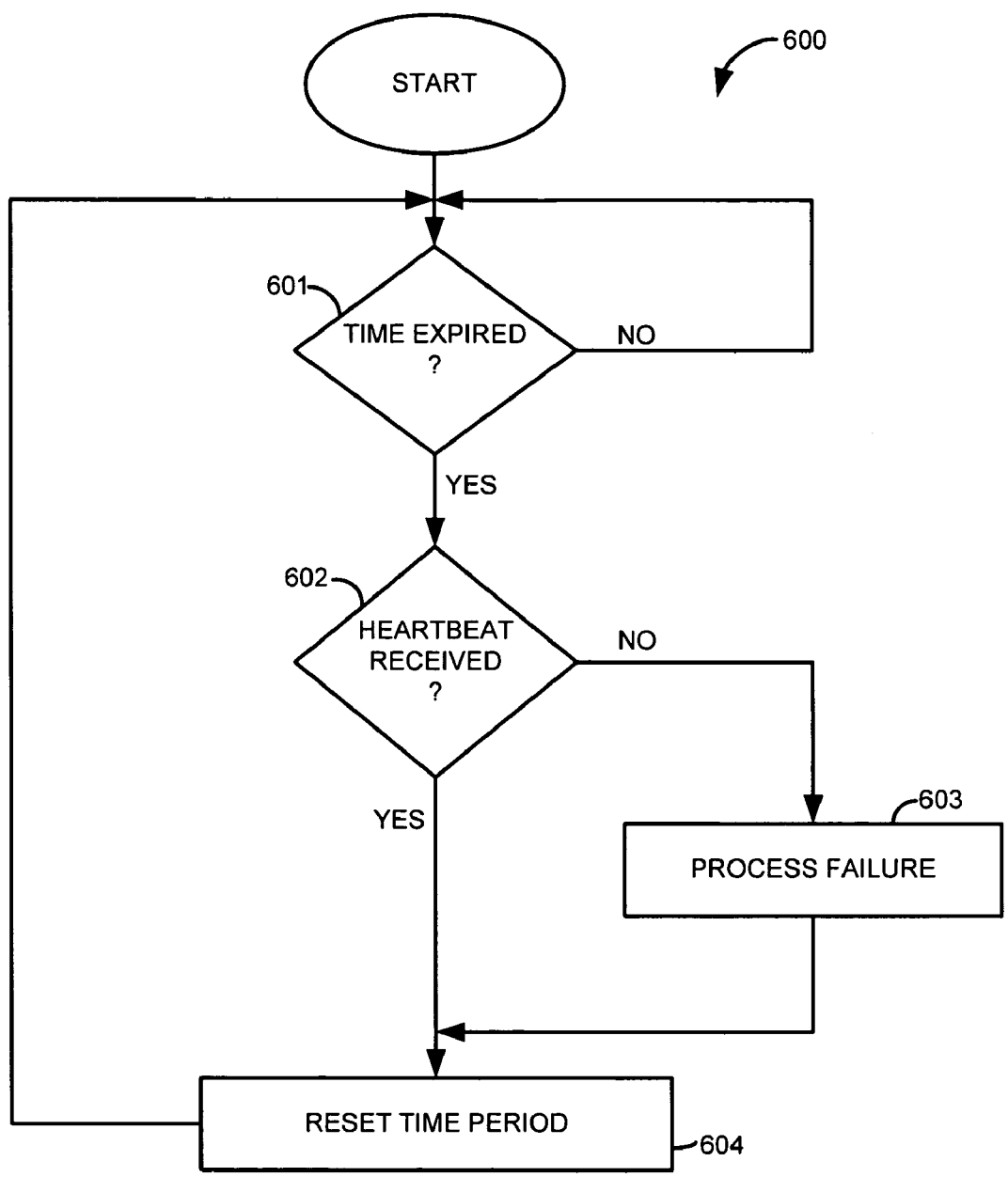
FIG. 6 is a flowchart of a method of testing a SOC that includes a NOC according to yet another embodiment of the invention.

FIG. 6 is a flowchart 600 of a method of testing a SOC 100 that includes a NOC 101 according to yet another embodiment of the invention. In step 601, the ITP 105 determines whether a heartbeat time period has expired. If the heartbeat signal is received periodically from a SOC component, it can be determined that the component is functioning. If the heartbeat signal ceases to be received, it can be determined that the component has suffered a failure, is not receiving adequate electrical power, a processor component is locked up or a processor program counter (PC) is incorrect, etc. Other component problems can be detected by the absence of the heartbeat signal, and are not listed but are intended to fall within the scope of the description and claims. If the heartbeat time period has expired, the method proceeds to step 602; otherwise the method loops until the heartbeat time period expires.

In step 602, the ITP 105 determines whether a heartbeat signal has been received. If the heartbeat signal has been received, the method proceeds to step 604; otherwise the method branches to step 603.

In step 603, the heartbeat signal has not been received within the heartbeat time period. Therefore, the ITP 105 can determine that a heartbeat error has occurred. The heartbeat error can signify a communication problem between the ITP 105 and the subject component (including a problem with a physical link), or can signify a problem with the subject component. The heartbeat error can be logged. The heartbeat error can optionally be transmitted to an exterior device or network.

In step 604, the heartbeat time period is reset. Subsequently, the ITP 105 can perform another iteration of the heartbeat detection loop and can continue to monitor heartbeat signals from the subject component. It should be understood that the ITP 105 can perform a heartbeat monitoring process for any component of the SOC 100.

Figure 7:
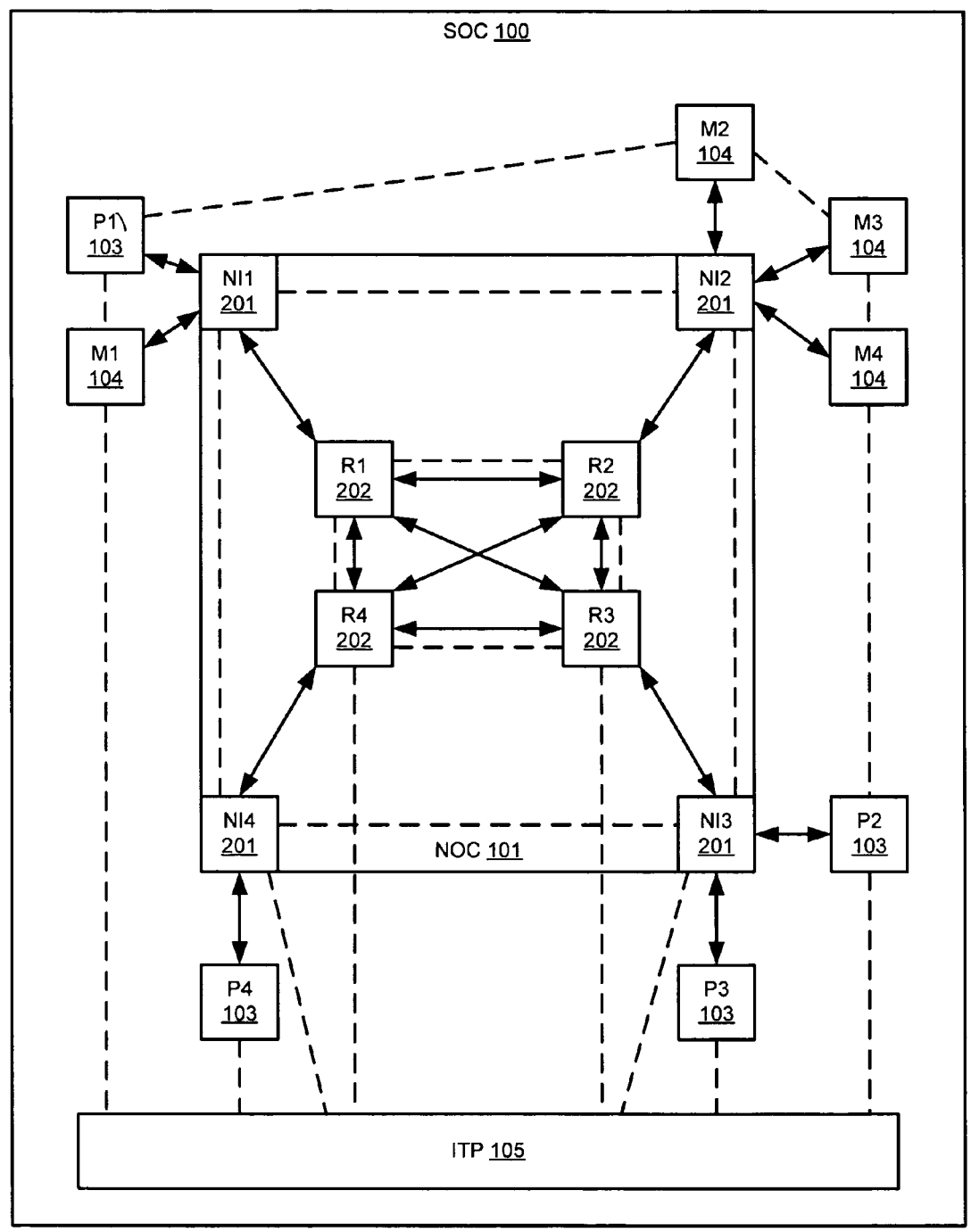
FIG. 7 shows the SOC according to yet another embodiment of the invention.

FIG. 7 shows the SOC 100 according to yet another embodiment of the invention. In this embodiment, the SOC 100 can include multiple processing systems (P1–P4 in the figure), multiple storage systems/memories (M1–M4 in the figure), multiple routers (R1–R4 in the figure), and multiple network interfaces (NI1–NI4 in the figure). As previously discussed, the ITP 105 can be connected to and in communication with each such component (dashed lines), and can test the physical links, logical functions, and system operations.

The ITP according to the invention can be employed according to any of the embodiments in order to provide several advantages, if desired. The invention can provide diagnostics and troubleshooting for a system on chip (SOC). The invention can provide diagnostics and troubleshooting for a SOC that includes a network on chip (NOC). The invention can provide diagnostics and troubleshooting for a SOC that includes multiple communication functions.

The invention can provide verification of a chip design and anticipated operation before the chip is manufactured. The invention can provide a testing capability after manufacture in order to ensure quality and reliability of the SOC before it is shipped to a customer. The invention can provide continued testing and diagnostic capability of the SOC during operation in order to ensure accuracy, reliability, and proper operation.

The invention can simplify and streamline troubleshooting. The invention can increase the confidence of continuing proper operation. The invention can reduce the time and effort required for diagnosis and repair of the SOC. The invention can ensure the continuing integrity of the SOC. The invention can provide a more robust, reliable SOC.

What is claimed is:

1. A method of testing a system on chip (SOC) that includes a network on chip (NOC), comprising:
  detecting a heartbeat time period in an integrated test processor (ITP) of the SOC;
  determining whether a heartbeat signal has been received from a SOC component; and
  setting a heartbeat error condition if the heartbeat signal was not received during the heartbeat time period.

2. The method of claim 1, wherein the SOC component comprises a NOC component.

3. The method of claim 1, wherein the SOC component comprises a network interface of the NOC.

4. The method of claim 1, wherein the SOC component comprises a router of the NOC.

* * * * *